United States Patent [19]

Fechner

[11] Patent Number: 5,753,955
[45] Date of Patent: May 19, 1998

[54] MOS DEVICE HAVING A GATE TO BODY CONNECTION WITH A BODY INJECTION CURRENT LIMITING FEATURE FOR USE ON SILICON ON INSULATOR SUBSTRATES

[75] Inventor: Paul S. Fechner, Plymouth, Minn.

[73] Assignee: Honeywell Inc., Minneapolis, Minn.

[21] Appl. No.: 770,616

[22] Filed: Dec. 19, 1996

[51] Int. Cl.⁶ .......................... H01L 27/01; H01L 27/12; H01L 27/095; H01L 29/861

[52] U.S. Cl. .......................... 257/347; 257/350; 257/471; 257/481

[58] Field of Search .................... 257/347, 350, 257/471, 481

[56] References Cited

PUBLICATIONS

IEEE Transactons on Electron Devices, vol. ED-34, No. 4, April, 1987, "An SOI Voltage-Controlled Bipolar-Mos Device", by Jean-Pierre Colinge, pp. 845-849, Apr., 1987.

*Primary Examiner*—Steven H. Loke
*Attorney, Agent, or Firm*—Gregory A. Bruns

[57] ABSTRACT

A MOS transistor formed in a silicon on insulator structure includes a rectifying connection between a body portion and the gate. The connection decreases the threshold voltage of the transistor in the reverse bias state and limits a difference in voltage between the body and gate in the forward bias state of the rectifying contact.

9 Claims, 2 Drawing Sheets

1

MOS DEVICE HAVING A GATE TO BODY CONNECTION WITH A BODY INJECTION CURRENT LIMITING FEATURE FOR USE ON SILICON ON INSULATOR SUBSTRATES

BACKGROUND OF THE INVENTION

The present invention relates generally to semiconductors and specifically to metal oxide semiconductors (MOS) formed in silicon on insulator (SOI) substrates. Integrated circuits formed in silicon on insulator (SOI) wafers are increasingly used for low power and low voltage circuits. Many applications of integrated circuits are requiring lower power supply voltages. While historically it was common to utilize 5 volt supplies, presently there are requirements for 3.3 volt, 2.5 volt and even lower voltage supplies for portions of systems. Future systems are predicted to operate with power supply voltages of less than 1.0 volt. The reasons for this requirement include significantly lower power consumption, with the power scaling with the square of the voltage and the fact that improved performance is obtained when the voltage swing is limited to a lower value. The lower power supply voltages may be required for only a portion of a system.

Standard MOS transistor theory predicts that a positive bias applied to the body of a partially depleted NMOS transistor reduces the threshold voltage thus increasing the drive of the transistor for a given gate voltage applied. Fabrication of NMOS devices on SOI makes it practical to do this at the individual transistor level where the gate and body terminals can be electrically connected but isolated from other transistors. This leads to a threshold voltage which is a function of the gate voltage, Vg, where its highest value is with Vg=Vs=Vss and lowest value with Vg=Vdd. However, forward bias of the source PN junction causes a high DC gate current flow limiting the maximum Vdd to about 0.5V in order to maintain acceptable static current.

Connecting the gate to the body of MOS transistors built on SOI has been identified as a promising technology for very low voltage/low power applications. However, due to forward bias of the body to source junction power supply voltages must be limited to about 0.5V in order to suppress the DC gate current through the body connection.

Thus there is a need for a device that will provide for a lower threshold voltage and thereby increase the device drive at power supply voltages in the greater than 0.5V range.

SUMMARY OF THE INVENTION

The present invention solves these and other needs by providing a connection between a body portion of the transistor and the gate. The connection is a rectifying connection that limits the DC current between the body and the gate in the transistor "on" state while limiting the body potential to be a few tenths of a volt above the source potential in the transistor "off" state.

DETAILED DESCRIPTION

The description below is stated in terms of an NMOS transistor but is equally applicable to PMOS transistors where Vss and Vdd exchange roles and potentials.

Figure 1:
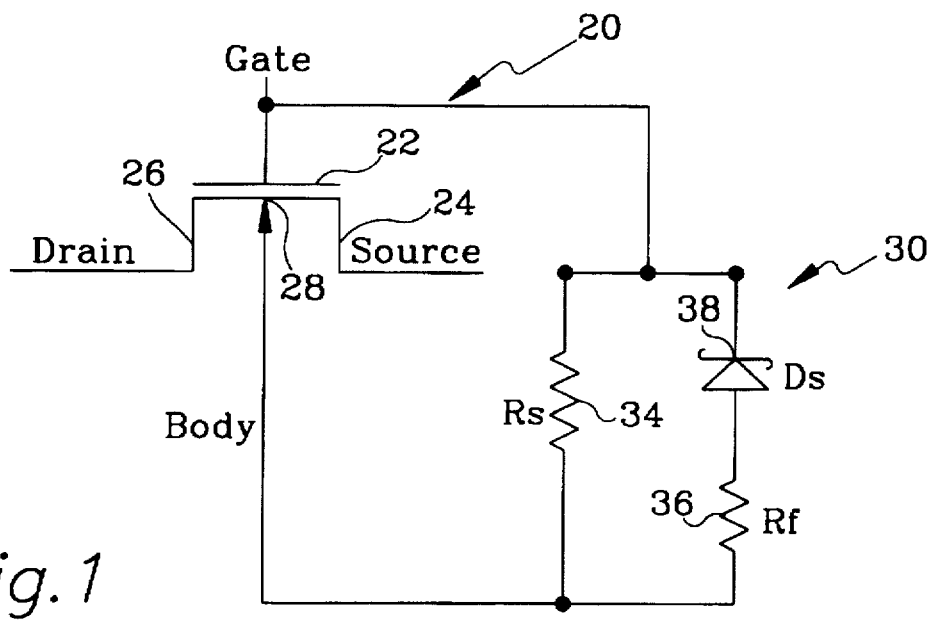
FIG. 1 is a schematic drawing of an n-channel transistor in accordance with the principles of the present invention.

An n-channel transistor 20 having gate 22, source 24, drain 26 and body 28 is shown schematically in FIG. 1. A Schottky diode contact 30 is connected between gate 22 and body 28. Schottky diode contact 30 includes parasitic schottky resistance 34 diode forward resistance 36, and diode 38. Schottky contact 30 is connected so that it is turned on when a voltage at body 28 exceeds a voltage at gate 22, Vg, by a few tenths of a volt.

However, in the typical operation mode where Vg is greater than 0.5V the reversed biased schottky 30 acts as a high resistance element to limit the current which will flow through the forward biased body 28 to source 24 PN junction of n-channel transistor 20. The DC gate current becomes limited by the reverse bias parasitic resistance 34 which can be in the $10^6$ ohms to $10^{12}$ ohms range depending upon the quality of the schottky diode and the voltage applied.

Thus Vdd is limited only by the schottky reverse bias IV characteristic and the Idd requirements for the part permitting Vdd>0.5V operation while maintaining the performance advantage of the gate to body connected device.

Figure 2:
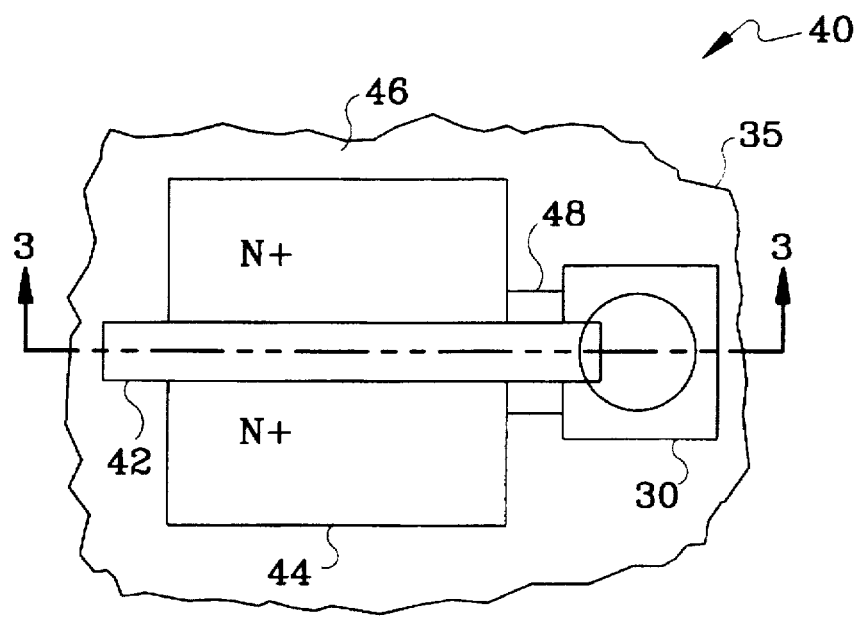
FIG. 2 is a top plan view of one layout of the transistor of FIG. 1.
Figure 3:
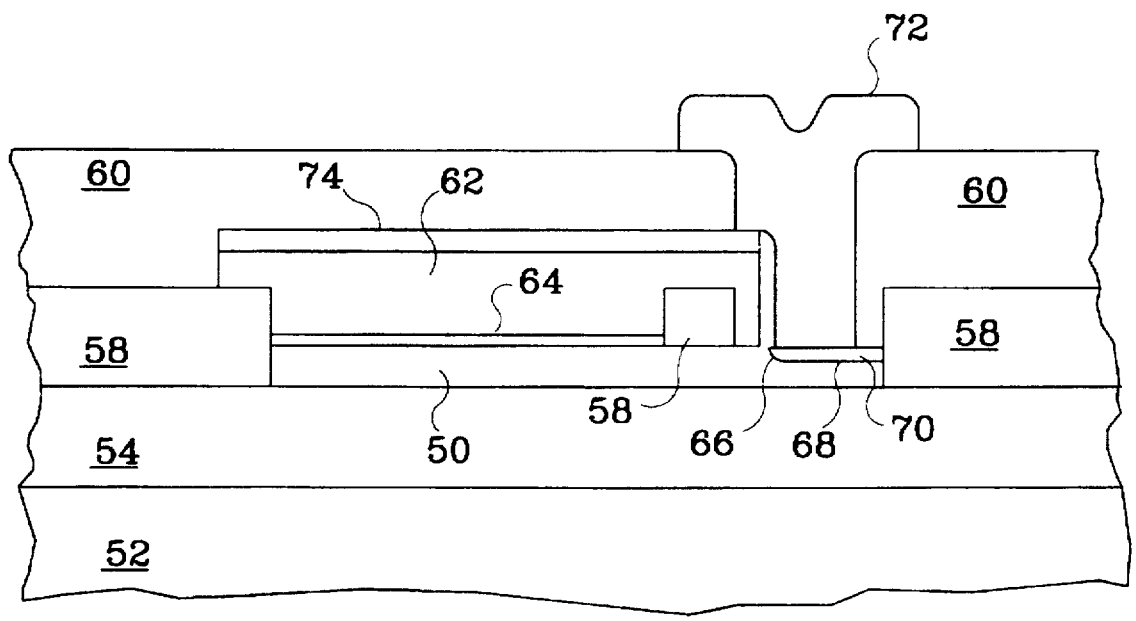
FIG. 3 is a cross-sectional view of the transistor of FIG. 2 along section line 3—3.

A simplified layout drawing of one embodiment of an n-channel transistor 40 formed in a SOI portion 35 is shown in FIG. 2. Transistor 40 has a gate 42, source 44, drain 46. Body tie 48 is connected to body 50 of transistor 40. FIG. 3 shows a SOI structure including a silicon substrate 52, buried oxide layer 54 and thin silicon layer or body 50. Field oxide 58 and contact oxide 60 are also shown in FIG. 3. Transistor 40 includes body 50, polysilicon gate 62 and gate oxide 64. Resistive Schottky contact 66 is provided by forming a connection 68 between silicide portion 70 and underlying P-silicon body 50. Contact 72 makes ohmic contact to polysilicon gate 62 via silicide 74 and also makes ohmic contact to silicide portion 70. Titanium Silicide (TiSi$_2$) may be used to form the schottky connection to body 50 or other suicides or metal to silicon rectifying contacts may also be used.

Figure 4:
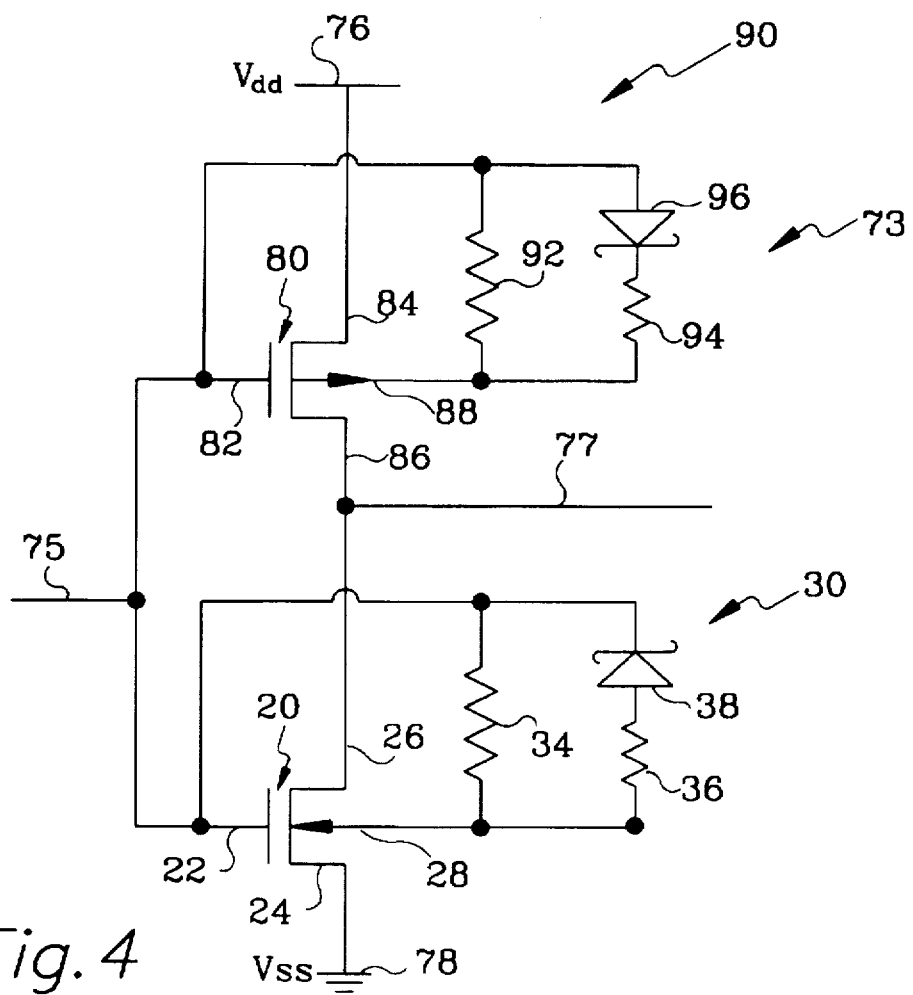
FIG. 4 is a schematic of a gate-type circuit utilizing the principles of the present invention.

The use of the present invention can be illustrated with reference to a gate type circuit 73, including Vdd or power supply 76, Vss or ground 78, input 75 and output 77 as shown in FIG. 4. Circuit 73 also includes n-channel transistor 20 schottky contact 30 and p-channel transistor 80. P-channel transistor 80 includes gate 82, source 84, drain 86 and body 88. A schottky contact or diode 90 is connected between body 88 and gate 82. Diode 90 includes parasitic schottky resistance 92, diode forward resistance 94 and diode 96. Diode 90 is connected so that it is turned on when voltage at gate 82 exceeds voltage at body 88 by a few tenths of a volt.

When input 75 of circuit 73 is low, output 77 is high. The N-channel transistor 20 is turned off and its body potential= Vg=0 under steady state. The p-channel transistor 90 is turned on with a DC gate current to be supplied by input 75, limited by parasitic resistor 92.

When gate 22 of N-channel transistor 20 changes from 0V to Vdd, the gate potential (Vg) is capacitively coupled to body 28 of transistor 20 through the gate to body capacitance, Cgb, as well as DC coupled through the schottky contact 30. Since there is no electrical potential difference between the gate and body terminal the gate to body capacitance does not exist as an active load to consume power or slow down the gate switches. As the gate voltage and body voltage rise, the NMOS threshold lowers until the transistor turns on somewhere between 0.3 and 0.5V depending upon the well doping configuration. The subthreshold slope is nearly ideal since it has no depletion charge term in it making it as good or better than that of a fully depleted MOS transistor on SOI. Once the device turns on, essentially all the gate oxide capacitance is to the inverted channel and the body voltage becomes limited by the forward bias potential of the body to source PN junction. The remaining gate voltage then appears across the reverse biased schottky diode. Assuming the resistance 34 is large relative to the current sourcing capability of the previous gate the transistor functions as a low threshold voltage, Vt, device with a DC gate current equal to the current through the reverse biased schottky 30. Thus rectifying contact or schottky 30 connected between body 28 and gate 20 acts to reduce a threshold voltage of transistor 20 while limiting a direct current by the reverse schottky resistance 34.

When transistor 20 is turned off with Vg going from Vdd to Vss=0, any drain avalanche current into the body becomes grounded through the forward biased schottky to the gate terminal preventing snapback induced latch-up by preventing turn on of the parasitic lateral bipolar transistor. Schottky 30 will limit the voltage difference between body 28 and gate 20 to less than 0.5 volts. Under high speed dynamic conditions the charge stored in the body actually lowers the threshold even further permitting the device to turn on the next time at a lower threshold than when it switched the first time. For logic gates that are not switched very often the charge in the body will be conducted through the non-ideal schottky resistance back to Vg=0 and the subthreshold leakage current will relax back to its static state. Only dynamic nodes will experience "off" currents above the static state which will typically be much less than the dynamic currents involved. If desired, the slower dynamic or static nodes such as in a SRAM cell can be implemented without the gate to body connection to minimize static leakage current for a given Vdd. This is possible because Vdd in the greater than 0.9V range is sufficient to provide standard CMOS operation for slower to static nodes in the circuit while producing much less than 1 na of current/gate to the body tie connection. This allows the circuit designer to optimize the design of each part of the circuit for speed or static current producing significant performance improvements with negligible increases in either static or dynamic currents.

A new device structure is described which places a schottky diode in series with the body connection to reduce the gate to body current to acceptable levels at higher power supply voltages limited only by the reverse bias leakage of the schottky diode. This permits both standard transistor logic without the gate connected to the body to be fabricated on the same chip as the new device in order to be able to configure the design to maximize performance on high speed dynamic logic while eliminating the DC leakage component on slower or static nodes such as might be found in an SRAM cell.

In accordance with the foregoing description, Applicant has developed a MOS device having a gate to body connection with a body current limiting feature for use with SOI substrates. This method may easily be incorporated into fabrication procedures for semiconductor devices. Although a specific embodiment of Applicant's device is shown and described for illustrative purposes, a number of variations and modifications will be apparent to those of ordinary skill in the relevant arts. It is not intended that the coverage be limited to the disclosed embodiment, but only by the terms of the following claims.

I claim:

1. A MOS transistor comprising:

a silicon substrate;

an insulative layer formed on said silicon substrate;

a thin layer of lightly doped silicon of a first conductivity type formed on said insulative layer;

said thin layer of silicon having source and drain regions of a second conductivity type formed therein and extending down to said insulative layer;

a body portion of said thin layer of silicon separating said source region and said drain region;

a gate overlying said body portion; and a rectifying connection between said body portion and said gate to reduce a threshold voltage of said transistor while limiting a gate current to a first level when said transistor is turned on and limiting a voltage difference between said body and said gate when said transistor is turned off.

2. The MOS transistor of claim 1 wherein said rectifying connection comprises a silicide connected to said lightly doped silicon.

3. The MOS transistor of claim 1 wherein said rectifying connection is a schottky diode.

4. The MOS transistor of claim 2 wherein said silicide comprises titanium silicide and said difference in voltage is less than 0.5 volts.

5. A MOS transistor comprising:

a silicon substrate;

an insulative layer formed on said silicon substrate;

a thin layer of lightly doped silicon of a first conductivity type formed on said insulative layer;

said thin layer of silicon having a source region and a drain region of a second conductivity type formed therein;

a body portion of said thin layer of silicon separating said source region and said drain region;

a gate overlying said body portion; and a rectifying connection between said body portion and said gate, said rectifying connection having a reverse resistance to limit a gate current to a first value when said transistor is turned on and a forward resistance to limit a voltage difference between said body and said gate when said transistor is turned off.

6. The MOS transistor of claim 5 wherein said rectifying connection comprises a silicide connected to said lightly doped silicon.

7. The MOS transistor of claim 5 wherein said rectifying connection is a schottky diode.

8. The MOS transistor of claim 6 wherein said silicide comprises titanium silicide and said difference in voltage is less than 0.5 volts.

9. The MOS transistor of claim 5 wherein said reverse resistance is in the range of $10^6$ to $10^{12}$ ohms.

* * * * *